(12) United States Patent
Liu et al.

(10) Patent No.: US 8,589,110 B2
(45) Date of Patent: Nov. 19, 2013

(54) SYSTEM AND METHOD FOR PROGRAMMABLE AUTOMATIC TESTING OF POWER SUPPLIED

(75) Inventors: Guang Liu, Lake Zurich, IL (US); Alex Kurnia Choi, Lake Zurich, IL (US)

(73) Assignee: Synergistic Technologies Solutions, Inc., Buffalo Grove, IL (US)

( * ) Notice: Subject to any disclaimer, the term of this patent is extended or adjusted under 35 U.S.C. 154(b) by 1287 days.

(21) Appl. No.: 12/380,663

(22) Filed: Mar. 3, 2009

(65) Prior Publication Data
US 2010/0225466 A1 Sep. 9, 2010

(51) Int. Cl.
*G01R 31/40* (2006.01)
*G01R 31/42* (2006.01)

(52) U.S. Cl.
USPC ....... 702/118; 324/764.01; 702/117; 702/121

(58) Field of Classification Search
USPC ................. 702/117, 118, 121; 324/764.01
See application file for complete search history.

(56) References Cited

U.S. PATENT DOCUMENTS

| | | | | |
|---|---|---|---|---|
| 4,850,104 A | * | 7/1989 | Matrone et al. | 29/829 |
| 6,441,637 B1 | * | 8/2002 | Neeb | 324/762.02 |
| 8,401,812 B2 | * | 3/2013 | Schmitz | 702/117 |
| 2005/0246589 A1 | * | 11/2005 | Tsai et al. | 714/38 |
| 2008/0314168 A1 | * | 12/2008 | Zhang et al. | 73/865.6 |
| 2012/0185201 A1 | * | 7/2012 | Chen | 702/118 |

* cited by examiner

*Primary Examiner* — Sujoy Kundu
*Assistant Examiner* — Regis Betsch

(57) ABSTRACT

A cost-effective system architecture and apparatus for programmable automatic power supply testing. The system utilizes board level interface between various system testing modules and an Automatic Test Controller (ATC). The ATC receives coded test requests from the software on an industrial PC and control the various testing modules inside ATC to execute the tests. Test results were sent back to the PC and saved in a result file. A single industrial PC can control two or more ATC's and test two or more power supply units simultaneously. The ATC based test system is lower cost than the conventional Automatic Test Equipment which uses device level interface and standardized test devices.

16 Claims, 5 Drawing Sheets

SYSTEM AND METHOD FOR PROGRAMMABLE AUTOMATIC TESTING OF POWER SUPPLIED

CROSS-REFERENCE TO RELATED APPLICATIONS

Not applicable.

FIELD OF THE INVENTION

This invention relates to a cost-effective system architecture and apparatus for programmable automatic power supply testing.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAMLISTING COMPACT DISC APPENDIX

Not applicable.

BACKGROUND OF THE INVENTION

An automatic power supply test system is used to test the performance of a power supply. These test systems automatically measure the parameters such as input voltage, current, power, power factor, output voltage, current, ripple and noise, short-circuit protection, over-voltage protection (OVP) and over-current protection (OCP) of a power supply. An automatic power supply test system is often used in power supply production line to ensure products meet the specifications before they are packed for shipment. An automatic power supply test system usually consists of a central computer with application software to control an automatic power source, a power analyzer, an electronic load, a multi-channel DC voltage/current meter, a ripple/noise measurement device and some special circuitry to tests the protection functions. Furthermore, an automatic power supply test system needs to be user programmable so it can be used to test power supplies of various types and power ratings.

FIG. 1 is the block diagram of a typical automatic power supply test system existing today. The system has an industrial PC as the central computer. The PC communicates to various system components via a standard communication bus, such as IEEE488 bus. From the PC, a user can edit the test requirement through the application software. For instance, if the user wants to test the efficiency of a power supply, he/she would, through the application software, set the Automatic Power Source 12 to the nominal input voltage of that power supply, set the electronic load 16 to draw the rated output current of that power supply, set the Power Analyzer 13 to measure the input power of the power supply, and set the Precision DC meters 15 to measure the output voltage and current of the power supply. He/she also needs to setup the application software to calculate the efficiency using the collected measurement results and output the efficiency to a desired file and in desired format.

While this conventional architecture has the flexibility to allow the user to program each system components freely, its drawback is the relatively high cost. First, to communicate with the PC through IEEE488 bus, every system component needs to have the IEEE488 interface circuitry. Second, the various system components are often standard equipment that has human interface and other features that are not necessary for the automatic test system.

The main objective of the current invention is to achieve lower cost system architecture for the same test functionality. Another objective of the current invention is to have two or more test units operating at the same time, controlled by the same PC, sharing the same programmable power source and operated by a single operator in a power supply production line. This allows higher throughput and better work efficiency for the production line.

BRIEF SUMMARY OF THE INVENTION

One key part of the current invention is the Automatic Test Controller (ATC). It serves as the core of the automatic test system. FIG. 2 shows the signal flow of the current invention. The ATC has two serial communication links. One serial link 51 connects the ATC with the industrial PC. The other serial link 55 connects the ATC with the programmable power source. The output of the programmable power source sends the power to the ATC via the power cable 56. The input of the power supply UUT receives power from the ATC via power cable 57; and the output of the power supply UUT is connected to the ATC via power cable 58. A Digital Signal Processor (DSP) chip inside the ATC works as the main control device for the ATC. The various components of the automatic test system, such as power analyzing module, electronic load module and precision multi-channel DC measurement module, etc., are dedicated modules mounted inside the ATC. These modules are linked to the DSP with board level interface, such as General Purpose Input-output (GPIO) pins, Analog-to-Digital Converter (ADC) inputs, Pulse Width Modulated (PWM) outputs and Serial Peripheral Interface (SPI) ports. The dedicated automatic test components described above are much lower cost compared to the standard test devices used in the conventional automatic test systems. The board level interface between various components and the DSP is much lower cost than the external interface, e.g. IEEE488 bus, used in the conventional automatic power supply test systems.

In the current invention, an application software is installed on the industrial PC to allow user programming. A library of power supply test sets is included in the application software. The user can select the required test sets to be performed and setup the corresponding parameter limits. The tests are arranged in a "sequence" which consists of multiple test sets. The PC software transmits the test information one test set at a time with a predetermined protocol from PC to the ATC. The PC application software waits for the results from the previous test set returned by the ATC before sending next test set to the ATC. This process repeats until all test sets in the test sequence are completed. The DSP inside the ATC controls various dedicated components of the test system to perform the requested tests and send back the results. Since the communication between the PC and the ATC is limited to only the encoded test requests and test results that is checked and verified for data integrity, a serial link with moderate speed would be sufficient. In the preferred embodiment, a standard RS232 connection is used for communication between the PC and the ATC.

Of all the required system components for the automatic test system, only the automatic power source is external to the ATC. This is necessary since one of the objectives of this invention is to use single power source to supply two or more ATC test units.

One aspect of the current invention is the ability to handle very long test sequences. Since the requested tests were sent from the PC to the ATC one frame at a time, there is virtually no limit on how many test sets the system can test. The user can pick any test sets in any combination to form the test sequence he/she wishes.

In real applications, the user first creates a test sequence file using the application software for a particular power supply he/she wants to test. The user can then setup the test with the test sequence file using the same application software. When the Unit Under Test (UUT) is connected to the ATC and ready to be tested, the user would press a Test START switch on the ATC. The ATC then sends a START signal to the PC software. The PC software responds by sending the test request to the ATC frame by frame according to the test sequence file. The DSP inside the ATC receives the encoded test request from the PC via the serial link 51. Based on the decoded test request, the DSP sets up the programmable power source via serial link 55 for the pending test. The DSP also sets up other components necessary for the test through board level interface. When one test set is completed, test results are sent back to the application software on the PC via the serial link 51. The application software on PC would store the results and send the next frame of test request. If it reaches the end of the test sequence, the PC software and the DSP both loop back to wait for the next UUT.

Another aspect of the current invention is to allow a single operator to operate two or more test units simultaneously with a single PC and programmable power source. This is achieved by using a "Sync Box" that synchronizes two or more test units (ATCs) so they can share the same programmable power source. Operating two ATC simultaneously further reduces the equipment cost and improves the production line efficiency.

DETAILED DESCRIPTION OF THE INVENTION

Figure 1:
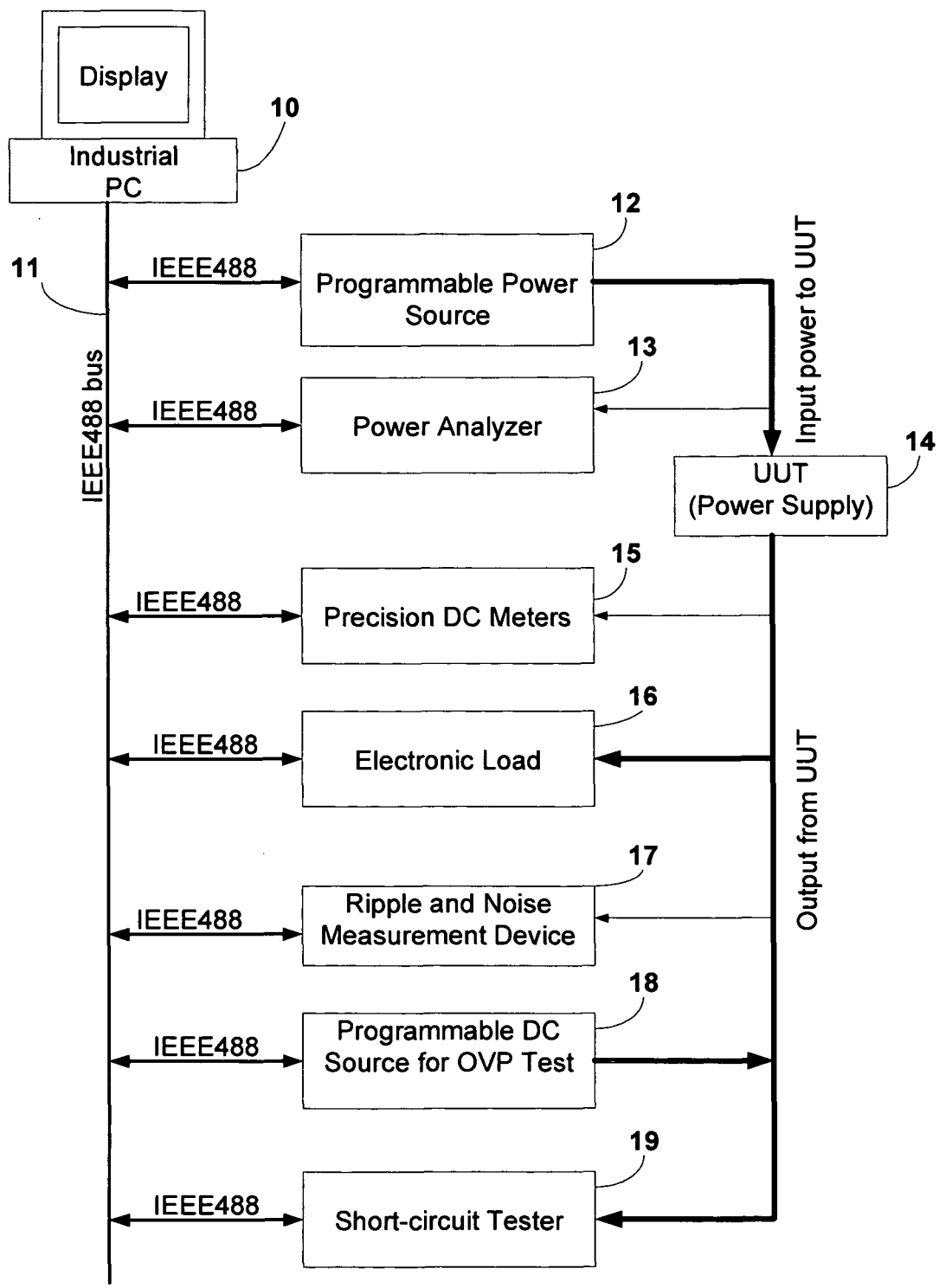
FIG. 1 (Prior Art) is the block diagram illustrating the architecture of an existing automatic power supply test system.
Figure 2:
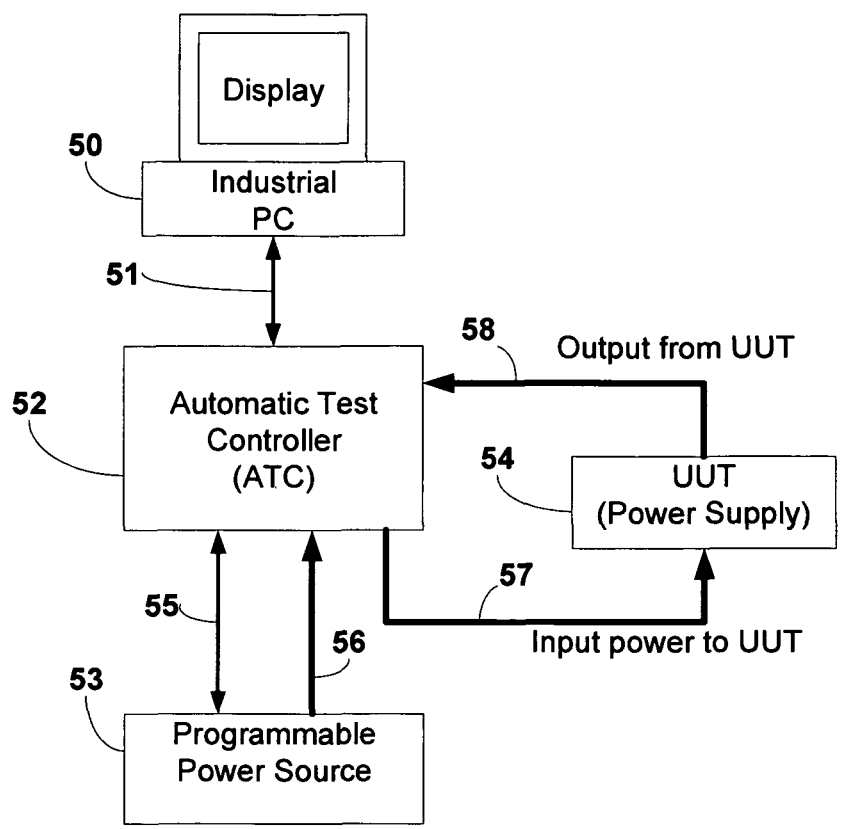
FIG. 2 is the block diagram illustrating the signal flows of the current invention.
Figure 3:
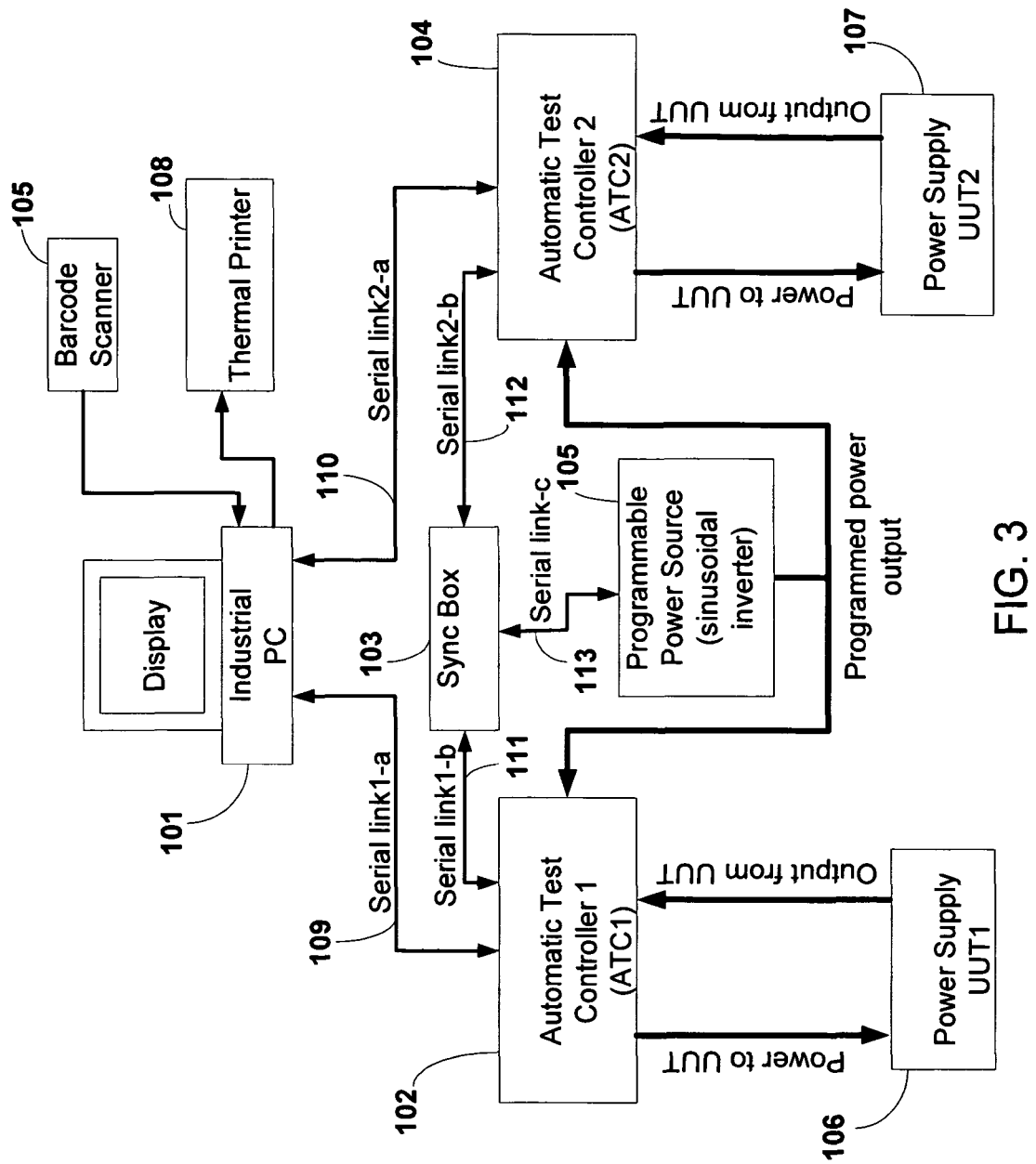
FIG. 3 is the block diagram of the preferred embodiment.

FIG. 3 illustrates the block diagram of the preferred embodiment of the current invention. The industrial PC 101 is connected to two ATC's via serial links 109 and 110. The programmable power source 105 supplies power to both ATC's (102 & 104). The pace of the two ATC's is synchronized by the Sync Box 103. The Sync Box receives requests to set up the programmable power source from both ATC's via serial links 111 and 112. The requests generally come at slightly different time instances. The Sync Box waits for both requests to arrive before setting up the programmable power source via serial link 113. This ensures both ATC's to have stable power source at specified voltage and frequency for the upcoming test set. The configuration of a typical test set generally consists of the following parts: 1) Set the power source voltage and frequency; 2) set the load type (Constant Current—CC, Constant Voltage—CV or Constant Resistance—CR load) and load value (A, V or Ohm); 3) select parameters to be tested and their limits. Once the test set information is sent to the ATC's, the DSP inside each ATC sets up the electronic load and other components that are necessary for the test. Once the test configuration is complete, the DSP's (in ATC1 and ATC2) enable the power source and the electronic load to the corresponding UUT (UUT1 106 and UUT2 107). After specified wait time for the UUT's to power up and get settled down, each DSP would start measurement for the parameters specified in the test set. The test results from both ATC's are then sent back to the industrial PC via the serial links 109 and 110. Still referring to FIG. 3, 105 is a barcode scanner that is used to scan the barcode on the UUT's. When the system is running two ATC's as is in the preferred embodiment, the operator needs to scan the barcode on the corresponding UUT's as instructed by the application software. The barcodes will be saved in the result files in the same row as the test data for the corresponding UUT's. 108 is a printer for error code printout when a UUT fails the test. The error code indicates which specific type of failure has occurred. In practice, for each model of power supply, a table can be generated to list the possible causes of failure for each error code. This will help the factory repair workers to quickly locate the cause of failure and fix the failed unit.

Figure 4:
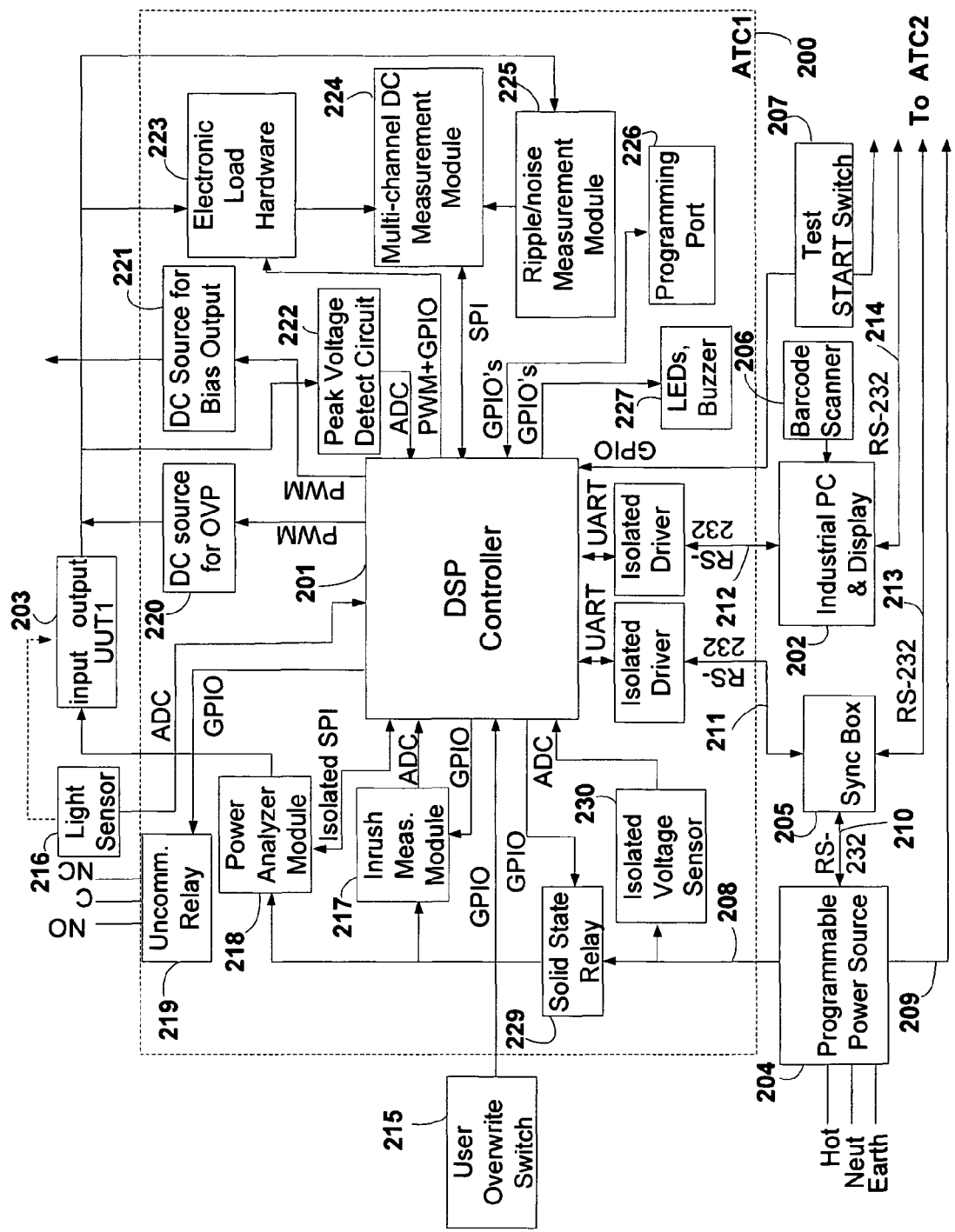
FIG. 4 is the block diagram of the Automatic Test Controller (ATC).

FIG. 4 is the block diagram of the Automatic Test Controller (ATC) and some surrounding components for the automatic power supply test system. The area inside the dotted rectangle is ATC1 (item 200 in FIG. 4). Referring to FIG. 4, 201 is the DSP controller, the main control device of the ATC. In the preferred embodiment, a DSP with greater than 40 MIPS processing power and greater than 128 KB flash memory is used. The power analyzer module 218 is linked to the DSP through an isolated SPI connection. The sensing elements (voltage and current sensors) on the power analyzer module are directly connected to the power input to the UUT. This results in voltage and current measurements with very low error and distortion. The power analyzer module is based on a high precision 24-bit Sigma/Delta ADC and is isolated by high-speed digital isolator. The DSP communicates with the Electronic Load hardware 223 through a PWM channel and some GPIO's. The set point of the voltage or current for the electronic load is determined by the pulse width of the PWM signal. An RC filter on the Electronic Load filters the PWM signal to obtain the set point value. The type of the load requested is set by GPIO pins from the DSP. The Multi-channel DC measurement module 224 is linked to the DSP via a SPI connection. The measurement module is based on a high precision 24-bit Sigma/Delta ADC. The measurement module measures the voltage and current of the electronic load (which is also the output voltage and current of the UUT). The measurement module also measures the ripple and noise level at the output of the UUT. The ripple/noise measurement module 225 has signal processing circuitry that generates peak to peak ripple/noise levels in high and low bandwidth. The low bandwidth signal is limited to 200 kHz; the high bandwidth signal is limited to 20 MHz. The peak voltage detect circuit 222 is used to catch the transient peak output voltage of the power supply UUT during power up and power down transient. The peak level is sent to an ADC input on the DSP. The block "DC source for OVP" (220) is a voltage controlled voltage source. It is controlled by the DSP through a PWM output. This DC voltage source is injected to the UUT to raise its output voltage in small steps for Over Voltage Protection (OVP) test. The DSP would monitor the UUT output in every step of voltage increase until the output of the UUT is shut off. If the trigger voltage is within the specified limit, the DSP would report OVP test passed. If the trigger voltage is outside of the specified limit, or if the UUT does not shut off after injected voltage reaches maximum, the DSP would report OVP test failed. Block 221 is a DC voltage source for Bias output. In some test situations, a bias voltage source comes in handy in simulating the real application condition. For instance, when testing a power supply for battery charging applications, the power supply usually has protection feature that would not start unless a proper battery is connected at the output. The bias voltage can be conveniently used to simulate that battery voltage so the power supply (UUT) output can be enabled and tested with the electronic load inside the ATC.

The output of the programmable power source 204 is connected to ATC1 via power cable 208; and to ATC2 via power cable 209. Block 205 is a Sync box. It receives voltage setup request from ATC1 via serial link 211, and from ATC2 via serial link 213. After synchronizing the requests, the Sync box sets up the programmable power source via serial link 210. Inside ATC1, the output of the programmable power source is connected to the solid state relay 229 via power cable 208. The turn-on phase angle of the solid state relay is controlled by the DSP. The isolated voltage sensor 230 sends the input voltage signal to an ADC pin on the DSP. Based on the input voltage signal, the DSP can control the turn-on time of the solid state relay relative to the phase angle of the input voltage. In most tests, the solid state relay is controlled to turn on when the AC voltage is at zero-crossing. This minimizes the inrush current during power up. For inrush current testing, the solid state relay is controlled to turn on at the peak of the sine wave voltage. This creates the consistent condition for testing the inrush current of the UUT. With the control of the solid state relay, the power from the programmable power source is sent to UUT1 203 through the power analyzer module 218. The power analyzer module measures the input RMS current and voltage, average power, reactive power, power factor, and harmonic power. An isolated SPI interface is used for communication between the power analyzer module and the DSP. The Inrush current measurement module 217 consists of a current transformer and a peak detection circuit. The captured peak current is sent to the DSP through an ADC channel.

219 is an uncommitted relay to provide flexibility for special test conditions. It can be used to connect or disconnect certain external components to create an intended test condition. The uncommitted relay is controlled by the DSP via a GPIO pin. 216 is a light sensor circuitry that sends an analog signal that is proportional to light intensity to an ADC pin on the DSP. The light sensor is useful to test the visual indicators on power supplies. 215 is a user overwrite switch. This is useful for reporting defects that are not tested by the ATC electrical measurement. For example, if the operator visually detected defects, such as a cracked enclosure, he/she can use the user overwrite switch to enter a fault. The ATC will generate a "user detected failure" as the test result. 206 is a barcode scanner. It is used to enter the barcode on a power supply being tested (UUT). If there is no barcode on the power supply, the ATC software will assign a sequential unit number to identify a particular unit. 207 is a Test START switch that generates the test start signal for both ATC 1 and ATC2.

The application software on the industrial PC has two parts: 1) Test Sequence Programming; 2) Test Execution.

In the programming part, various common power supply tests were grouped into test sets. Each test set includes a number of tests that have a given input voltage and frequency and output load type. Following is a list of the test sets and parameters tested in each test set:

1. Start-up test:
   Inrush Current
   Output Voltage Overshoot
   Start-up Time
2. Idle test:
   No load (Standby) Input Power
   No load (Standby) Input Current
   No load (Standby) Input Voltage
3. Standard CV (Constant Voltage region) test. Output load is Constant Current (CC) or Constant Resistance (CR) load:
   Input Current
   Input Power
   Input Voltage
   Power Factor
   Output Voltage
   Output Current
   Efficiency
   Ripple-Noise High Bandwidth (20 MHz)
   Ripple-Noise Low Bandwidth (200 KHz)
4. Standard CC (Constant Current region) test. Output load is Constant Voltage (CV) or Constant Resistance (CR) load:
   Input Current
   Input Power
   Input Voltage
   Power Factor
   Output Voltage
   Output Current
   Efficiency
5. Output Under Voltage (UVLO) test:
   Output Voltage
6. Short Circuit test:
   Input Current
   Input Power
   Input Voltage
   Power Factor
   Output Average Current
7. Over Current test:
   Over Current Protection Point
   Trip Point Voltage
8. Over Voltage test:
   Over Voltage Protection Point
9. Line Regulation test:
   Line regulation
10. Load Regulation test:
    Load regulation
11. Power Down test:
    Output voltage overshoot
    Holdup time
12. Support Function test:
    Delay time
    Output load discharge The upper and lower specification limits for each parameters listed in each test set are entered by the user. The user can select any test set and put them in any combination he/she wishes to form a test sequence for a specific power supply model. Inside each test set, the user can selectively check only the parameters that are necessary and leave other parameters unchecked (therefore total test time is reduced). Other test conditions such as wait time before measurement, load-on voltage (UUT output voltage threshold at which the electronic load is switched on), etc. can be set during the test sequence programming. Once the test programming is done, a test sequence file will be generated. The test sequence file can be write-protected by password so unauthorized person cannot alter the test sequence.

In the test execution part, the application software has provision for a test operator to load the pre-programmed test sequence file to the software test engine. The operator also needs to specify the file name for the test results. Once the test sequence is loaded and result file specified, the operator can click a start button on the application software to begin the test process.

Figure 5:
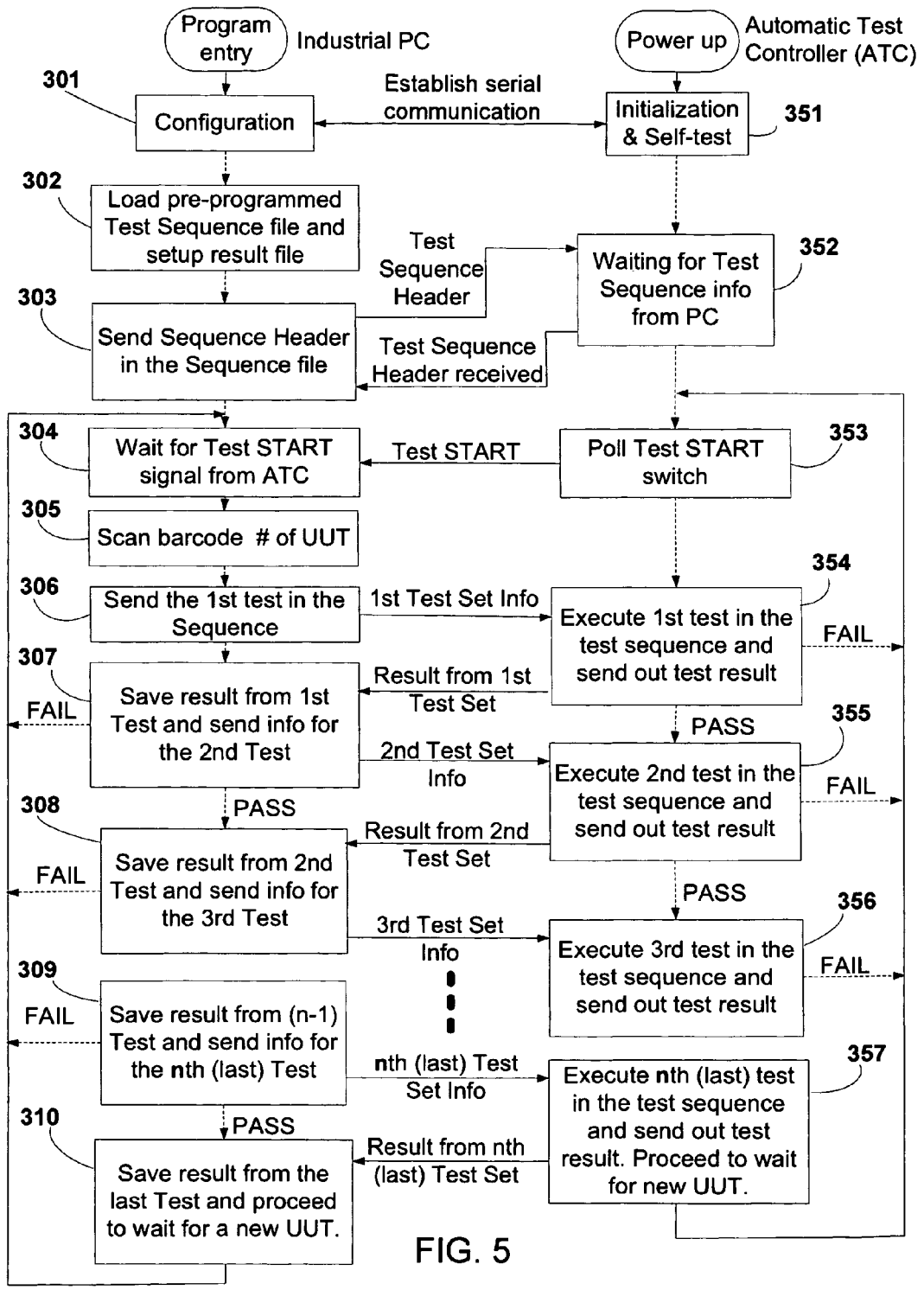
FIG. 5 is the block diagram depicting the communication between the PC and the ATC.

FIG. 5 is a block diagram showing the communication between the PC application software and the ATC DSP software during the test process. When the test execution part of the PC application software is entered, it would configure the software and try to establish serial communication with the ATC. If the ATC is powered up and finished initialization and self-test, the communication will be established successfully. Block 301 is the PC configuration, and block 351 is the ATC initialization and self-test. After PC software configuration is completed, the operator can load the test sequence file, select the result file and click the "START" button in the PC application software. At this point, the system enters the test mode. From the PC side, block 303 sends the test sequence header to the ATC. In the ATC side, block 352 sends an acknowledgement back to the PC.

The ATC then polls the Test START signal through a GPIO pin on the DSP. The Test START signal is generated when the test operator have connected the UUT to the ATC properly and press a Test START button on the ATC. If a Test START is detected, the ATC will send a Test START signal to block 304 in the PC side. Once received the Test START signal, the PC software will prompt the operator to scan the barcode on the UUT, if the barcode scan option is selected. If the barcode scan is not selected, the PC software will assign a unit number sequentially for the UUT. Once the barcode or unit number is done, the PC software block 306 sends the encoded test parameters for the $1^{st}$ test set (or $1^{st}$ test frame) in the test sequence. Block 354 in the ATC side receives the encoded test info for the 1st test set, it will decode and execute the test functions according to the test set parameters. The test results will be sent back to the PC. Block 307 on the PC side saves the test result for the 1st test set to the result file. If all the tested parameters are within the limits (passed), the PC software will send the encoded test parameters for the $2^{nd}$ test set in the test sequence to the ATC. If there is a failure in the $1^{st}$ test set, both the PC software and the ATC DSP software will stop testing for the current UUT. The PC software will display a "test failed" message on the PC screen and loop back to block 304 to wait for the Test START signal for the next UUT. The DSP software will sound buzzer and light up a red LED to indicate the failure, then loop back to block 353 to poll the Test START switch for the next UUT. In the case when all parameters passed in the $1^{st}$ test set and the encoded test information for the $2^{nd}$ test set is sent to ATC, Block 355 will decode, execute the test functions and send test results back to the PC software. On the PC side, block 308 saves the test result in the result file. If all the tested parameters are within the limits (passed), the PC software will send the encoded test parameters for the $3^{rd}$ test set in the test sequence to the ATC. If the $2^{nd}$ test set failed, both the PC software and the ATC DSP software will stop testing for the current UUT. The PC software will display a "test failed" message on the PC screen and loop back to block 304. The DSP software will sound buzzer and light up a red LED to indicate the failure, then loop back to block 353. On the ATC side, block 356 performs the same task as block 354 or 355, except it is for the $3^{rd}$ test set. The test process will continue with the same pattern until block 309 on the PC side. Block 309 saves the $(n-1)^{th}$ test set result and sends the $n^{th}$ (last) test set information to block 357 on the ATC side. Block 357 decodes, executes the $n^{th}$ test set and sends the result to block 310 on the PC side. At completion of block 357, the DSP software loops back to block 353 for the testing of next UUT. On the PC side, block 310 saves the test result for the $n^{th}$ (last) test set and display a "pass" message on the PC screen. Upon completion of block 310, the PC software loops back to block 304 for the testing of next UUT.

The operator can repeat the above process to test as many number of UUT's as he/she wishes. When the operator intends to stop the current test and start the testing of a different power supply model, he/she can click a "Release" button on the PC application software. This will disengage the PC application program from the ATC software. He/she can then load the test sequence file for the new power supply model and setup the new result file. The operator can go through the same process described in paragraph [0025] to test the new power supply model.

Although only the preferred embodiment has been described, those skilled in the art could make numerous alterations with the disclosed embodiment without departing from the spirit and scope of the current inventive subject matter set forth in the specification and claims. In methodologies directly or indirectly set forth herein, various steps and operations are described in one order of operation, but those skilled in the art will recognize that steps and operations may be rearranged, replaced or eliminated without necessarily departing from the spirit and scope of the present invention. It is intended that all matter contained in the above description or shown in the accompanying drawings shall be interpreted as illustrative only and not limiting. Changes in detail and structure can be made without departing in spirit and scope from the invention as defined by the appended claims.

What is claimed is:

1. A system for programmable automatic testing of a plurality of power supply units comprising:
   a computer that hosts application software and a user interface (UI) for programmable automatic testing of the plurality of power supply units, having a plurality of communication links connecting to a plurality of devices;
   a plurality of automatic test controllers (ATCs) with each one receiving test commands and parameter limits from the computer via a communication link, wherein the plurality of ATCs providing power and supplying a programmable test load, each ATC for connecting to and testing a power supply unit under test (UUT) from the plurality of power supply units;
   a programmable power source providing a programmable source of power to the plurality of ATCs;
   a sync box that provides communication between the programmable power source and all connected plurality of ATCs via communication links such that all connected plurality of ATCs can share the same programmable power source for UUT testing;
   the plurality of ATCs receiving via the communication links a synchronization signal from the sync box so the programmable power source is applied to all ATC connected UUTs at the right instance;
   the ATCs each controlling an internal electronic load module to apply the programmable test load consisting of a load type and level to the connected UUT for testing, controlling various internal measurement modules to measure requested power supply parameters of the UUT according to the test commands, determining the passing or failing of the UUT according to the test data and parameter limits, and sending the Pass/Fail information to the computer for display and storage.

2. The system for programmable automatic testing of power supplies of claim 1 wherein the plurality of devices connected to the computer includes one or more of:
- a barcode scanner that scans the barcode on the UUTs and sends them to the computer so the test record of a UUT is identified with its barcode;
- a printer connected to the computer for printing out error message for a failed UUT so as to provide clue for production line repair workers.

3. An automatic test controller (ATC) apparatus for programmable automatic testing of a power supply unit under test (UUT) wherein the ATC comprises:
- a processor as the main control device for the automatic test controller;
- a power analyzer module that is connected to the processor, wherein the power analyzer module measures the input voltage, current, real and apparent power, total harmonic distortion (THD) and power factor at the input of the UUT;
- an electronic load module that is connected to the output of the UUT, with the electronic load linked to the processor via pulse width modulation (PWM) channels and general purpose input/output (GPIO) pins, wherein the desired voltage or current for the power supply testing is set by the pulse width on the PWM channels, and the load type is set by the GPIO pins;
- a multi-channel direct current (DC) measurement module that is used to measure the output parameters of the UUT, having at least two channels measuring the output voltage and current, two other channels measuring the output from a ripple/noise measurement module, and communicating the measurement results to the processor via a board level synchronous peripheral interface (SPI) port connection;
- the ripple/noise measurement module wherein the input is connected to the output of the power supply UUT, and the outputs of the ripple/noise measurement module comprising two or more channels are connected to the multi-channel DC measurement module;
- an isolated communication link between the processor on the ATC and the computer, wherein the ATC both receives coded test information/command and transmit test results via this isolated communication link;
- an isolated communication link between the processor on the ATC and a Sync Box, wherein the programmable power source setting request is sent from the ATC to the Sync Box;
- a solid state relay that is connected between the programmable power source output and the power analyzer module in the ATC, wherein the solid state relay can be controlled to turn on either at the zero crossing or at the peak of the AC voltage waveform, and the solid state relay is controlled by the processor via a GPIO pin;
- an inrush current measurement module that catches the peak input current to the UUT, wherein the output of the inrush measurement module is fed to an ADC pin on the processor.

4. The ATC apparatus in claim 3 further comprises:
- a peak voltage detecting circuit connected to the output of the UUT, where the peak voltage of the UUT is captured and fed to the processor via an ADC channel;
- a first DC voltage source connected to the output of the UUT for Over-Voltage Protection (OVP) test, wherein the voltage level of this DC voltage source is controlled by a PWM signal from the processor;
- a second DC voltage source used to provide a bias voltage for a special test situation, wherein the voltage level of this DC voltage source is controlled by a PWM signal from the processor.

5. The ATC apparatus in claim 4 wherein the special test situation is a battery charger UUT and the second DC voltage source provides the voltage to emulate a battery during charger startup.

6. The ATC apparatus in claim 3 further comprising one or more of:
- at least one uncommitted relay that is controlled by the processor via a GPIO pin;
- one or more LED's that is used to provide user signals, wherein at least one LED of one colors indicating PASS and another Led of a different color indicating FAIL, and still another LED indicating whether the power is applied to the UUT;
- an audible alert device that gives out a short beep when a test set is successfully completed, and gives out multiple long beeps when a test failed;
- a Test START switch interface that feeds the external starting signal to a GPIO pin on the DSP, indicating users command to start testing;
- a User Overwrite switch interface that passes external User Overwrite signal to a GPIO pin on the DSP, allowing an operator to enter fault condition when a fault condition is observed by the operator;
- a DSP controller firmware programming interface that is connected between the DSP and an external serial programmer, wherein this interface allow field update of the software after the automatic test system has been deployed in the field;
- a light sensor interface to sense the lighted indicator on some UUTs.

7. The ATC apparatus of claim 6 wherein the uncommitted relays perform one or more of the following:
- the uncommitted relay being used to select the output voltage level of those power supply UUTs that have selectable output voltages;
- the uncommitted relay being used to short a component on a power supply UUT to create a fault condition on the UUT for fault protection testing.

8. A method for using an automatic test controller (ATC) apparatus for programmable automatic testing of a power supply unit under test (UUT), comprising:
- providing an automatic test controller (ATC) which has a main processor and a plurality of internal modules to perform the testing of a power supply unit under test (UUT) connected to the ATC;
- using board level communication links within the ATC to communicate between the main processor and the various modules;
- using a computer with user interface to pass test commands to the ATC and receive test results from the ATC via a communication link;
- using a programmable power source to provide power to the UUT under ATC control;
- using a Sync Box, wherein the programmable power source setting request is sent from the ATC to the Sync Box;
- using a solid state relay to control the precise instance when the power is applied to the input of the UUT;
- using a power analyzer module to measure input voltage, current, real power, apparent power, power factor, total harmonic distortion (THD);
- using an electronic load module to provide different load types and levels to the output of the UUT, wherein the desired voltage or current for the power supply testing is set by the pulse width on the PWM channels;

measuring the output voltage and current of the UUT using a multi-channel direct current (DC) measurement module having at least two channels measuring the output voltage and current, two other channels measuring the output from a ripple/noise measurement module;

wherein the outputs of the ripple/noise measurement module comprising two or more channels are connected to the multi-channel DC measurement module;

measuring the peak input current to the UUT using an inrush current measurement module.

9. The method of claim 8, further comprising one or more of:

using a peak voltage detection circuit to measure the output overshoot voltage of the UUT.

10. The method of claim 8, further comprising:

using one or more uncommitted relays to trigger external devices for special test conditions;

using a light sensor to detect the light indicator on the UUT;

using a first programmable DC voltage source for over voltage protection (OVP) test of the UUT;

using a second programmable DC voltage source to provide bias for special test requirement of the UUT;

using a set of LEDs and a buzzer to provide visual and audible indication of the test status;

using an isolated input voltage sensor to provide input voltage phase angle for inrush current test.

11. A method for programmable automatic testing of a plurality of power supply units, comprising:

providing computer user interface for users to generate test sequence files by selecting at least one test set and specifying parameters and their corresponding limits for each test set;

using a plurality of automatic test controllers (ATCs) with each one receiving test commands and parameter limits from the computer via a communication link, wherein the plurality of ATCs providing power and supplying a programmable test load, each ATC for connecting to and testing a power supply unit under test (UUT) from the plurality of power supply units;

providing a protocol for the communications between the computer and the plurality of ATCs such that the test sets are processed one by one, until the complete sequence has been processed;

providing a programmable power source providing a programmable source of power to the plurality of ATCs;

providing a sync box that provides communication between the programmable power source and all connected plurality of ATCs via communication links such that all connected plurality of ATCs can share the same programmable power source for UUT testing;

receiving by the ATCs via the communication links a synchronization signal from the sync box so the programmable power source is applied to all ATC connected UUTs at the right instance;

controlling by each ATC an internal electronic load module to apply the programmable test load consisting of a load type and level to the connected UUT for testing, controlling various internal measurement modules to measure requested power supply parameters of the UUT according to the test commands, determining the passing or failing of the UUT according to the test data and parameter limits, and sending the Pass/Fail information to the computer for display and storage.

12. The method of claim 11, further comprising:

loading a test sequence file on to the computer;

starting a test by sending a Test START signal to all connected ATCs;

passing the first test set information from the computer to the plurality of ATCs via communication links;

controlling plurality of ATCs to apply the desired load type/level and other test conditions on the UUTs;

controlling the plurality of ATCs to measure the specified test parameters of the UUTs;

comparing the measured parameters against the corresponding limits and determining passing or failing of the test;

passing the measured parameters and the PASS/FAIL information from the ATC to the computer via the communication link;

sending the subsequent test set information in the test sequence to the plurality of ATCs after receiving results of the previous test set from the plurality of ATCs;

displaying the test result of the previous test set for all UUTs on the user interface;

continuing to process all the test sets included in the test sequence file loaded to the computer;

ending the test at the completion of the last test set in the test sequence by displaying an overall PASS/FAIL result for each UUT.

13. The method of claim 11, further comprising: Providing an option in the user interface wherein a user can select excluding some data to be sent back to the computer to speed up the processing time, with "PASS/FAIL" being the minimum data allowable.

14. The method of claim 11, further comprising:

categorizing all power supply test types into a plurality of test sets, with each test set requiring a specific power source output and load condition applied to the connected UUT;

placing all the measurement, control modules and a main processor into a single enclosure forming an ATC for testing of power supplies;

having the main processor to communicate with the measurement and control modules via board level communication links.

15. The method of claim 14, further comprising one or more of the following:

defining a startup test set wherein the power source is applied to the UUT at the peak of the AC voltage waveform, and the input inrush current, output voltage overshoot, startup time of the UUT are measured;

defining an idle test set wherein the no-load input power, input voltage and input current of the UUT are measured;

defining a constant voltage (CV) region test set wherein the load is set to constant current (CC) or constant resistance (CR) mode, and the input voltage, current, power and power factor, THO and output voltage, current, voltage ripple and noise, and power supply efficiency are measured;

defining a constant current (CC) region test set wherein the load is set to constant voltage (CV) or constant resistance (CR) mode, and the input voltage, current, power and power factor, THD and output voltage, current, voltage ripple and noise, and power supply efficiency are measured;

defining an under-voltage lockout (UVLO) test set wherein the input voltage is set below the minimum operating voltage of the UUT and the output voltage is measured;

defining a short circuit (SC) test set wherein the load is set to short circuit condition, and the input current, voltage, real and apparent power, power factor, THO and output average current are measured;

defining an over-current protection (OCP) test set wherein the load current is increased by small steps until the UUT output is shut off, and the over-current protection trip point current and voltage are measured;

defining an over-voltage protection (OVP) test set wherein the DC source inside the ATC applies voltage to the output of the UUT in small incremental steps until the UUT output is shut off, and the voltage and current at the OVP trip point are measured;

defining a line regulation test set wherein two different input voltages are applied to the UUT with full load and the output voltages of the UUT at two different input voltages are measured;

defining a load regulation test set wherein two different load levels are applied to the output of the UUT, and the voltage and current are measured for both load conditions;

defining a power down test set wherein the output voltage overshoot and holdup time of the UUT are measured when the input power to the UUT is turned off;

defining a supporting function wherein a user specified delay can be executed, and a load discharge function can be performed at the end of a test to avoid electric shock hazard due to the residual charge on high voltage bulk capacitors on some UUTs.

16. The method of claim 11, wherein the communication method between the computer and the ATCs for programmable automatic testing of power supplies, comprising the steps of:

establishing the communication link between the computer and all the connected ATCs at the beginning of a test;

loading the pre-programmed test sequence file and setting up a test result file to be stored on the computer;

sending a Sequence Header in the sequence file to the connected ATCs;

waiting for acknowledgement from all the connected ATCs;

waiting for Test START signal from the ATCs once acknowledgements are received from all connected ATCs;

scanning the barcodes of the connected UUTs;

sending first test set information to the ATCs;

waiting for the ATCs to execute the first test set and send back the test result;

saving and displaying the first test set results and send the information for the second test set to the ATCs;

waiting for the ATCs to execute the second test set and send back the test result;

saving and displaying the second test set results and send the information for the third test set to the ATCs;

repeating the process until the last test set result is saved and overall test result is displayed;

looping back to wait for the Test START signal again from the ATCs for testing of the next batch of power supply UUTs.

\* \* \* \* \*

UNITED STATES PATENT AND TRADEMARK OFFICE
CERTIFICATE OF CORRECTION

PATENT NO. : 8,589,110 B2
APPLICATION NO. : 12/380663
DATED : November 19, 2013
INVENTOR(S) : Guang Liu et al.

Page 1 of 1

It is certified that error appears in the above-identified patent and that said Letters Patent is hereby corrected as shown below:

On the Title Page,

Item (54) and in the Specification, Column 1, Title,

"SYSTEM AND METHOD FOR PROGRAMMABLE AUTOMATIC TESTING OF POWER SUPPLIED" - should read "SYSTEM AND METHOD FOR PROGRAMMABLE AUTOMATIC TESTING OF POWER SUPPLIES"

Signed and Sealed this
Thirty-first Day of December, 2013

Margaret A. Focarino
*Commissioner for Patents of the United States Patent and Trademark Office*